United States Patent
Pless et al.

[11] Patent Number: 6,065,499
[45] Date of Patent: May 23, 2000

[54] LATERAL STRESS RELIEF MECHANISM FOR VACUUM BELLOWS

[75] Inventors: Alexander F. Pless, Rockport; Gary J. Rosen, Arlington; Allan D. Weed, Marblehead; Ernest E. Allen, Rockport; Victor M. Benveniste, Gloucester; Perry J. I. Justesen, Beverly, all of Mass.

[73] Assignee: Eaton Corporation, Cleveland, Ohio

[21] Appl. No.: 09/217,677

[22] Filed: Dec. 21, 1998

[51] Int. Cl.[7] ............................. F16L 11/00; F16L 11/16
[52] U.S. Cl. ............................................. 138/118; 138/119
[58] Field of Search ................................. 248/629, 667, 248/222.51; 138/118, 119

[56] References Cited

U.S. PATENT DOCUMENTS

| | | | |
|---|---|---|---|
| 3,106,414 | 10/1963 | Peters et al. | 285/226 |
| 3,692,337 | 9/1972 | Mischel | 285/226 |
| 3,770,303 | 11/1973 | Hallett | 285/45 |
| 3,773,087 | 11/1973 | Katayama | 138/120 |
| 3,915,482 | 10/1975 | Fletcher et al. | 285/226 |
| 3,983,402 | 9/1976 | Arndt, Jr. et al. | 250/492 A |
| 4,072,329 | 2/1978 | Mutchler | 285/187 |
| 4,383,178 | 5/1983 | Shibata et al. | 250/441.1 |
| 4,781,520 | 11/1988 | Balter | 414/751 |
| 4,791,963 | 12/1988 | Gronert et al. | 138/110 |
| 5,195,563 | 3/1993 | Brooks | 138/103 |
| 5,375,854 | 12/1994 | Carlisle et al. | 277/88 |
| 5,656,092 | 8/1997 | Blake et al. | 118/723 VE |

*Primary Examiner*—Andres Kashnikow
*Assistant Examiner*—Davis Hwu
*Attorney, Agent, or Firm*—John A. Kastelic

[57] ABSTRACT

An improved bellows assembly (18) is provided for use in, for example, an ion implanter (10). The bellows assembly comprises a first mounting portion (56) located at one end of the bellows assembly for fixedly mounting the bellows assembly to a first vacuum chamber (16); a second mounting portion (52) located at an opposite end of the bellows assembly for slidably mounting the bellows assembly to a second vacuum chamber (15); and a steel bellows (54) located between the first and second mounting portions. The bellows extends generally along a longitudinal axis (64) and is expansible and contractible along this axis. The second mounting portion permits radial slidable movement of the bellows assembly with respect to the second chamber in a first plane substantially perpendicular to this axis. The second mounting portion comprises at least one sliding seal subassembly (80) for maintaining the vacuum, and a support ring (78) and a slide plate (82) located on opposite ends of the sliding seal subassembly. The slide plate and the sliding seal subassembly provide a slidable vacuum-tight mating surface therebetween.

17 Claims, 4 Drawing Sheets

6,065,499

LATERAL STRESS RELIEF MECHANISM FOR VACUUM BELLOWS

RELATED APPLICATION

The following U.S. patent application, commonly assigned to the assignee of the present invention, is incorporated by reference herein as if it had been fully set forth: application Ser. No. 09/217,383, filed Dec. 21, 1998, and entitled ELASTOMERIC SLIDING SEAL FOR VACUUM BELLOWS.

FIELD OF THE INVENTION

The present invention relates generally to ion implantation equipment, and more specifically to a lateral stress relief mechanism for a vacuum bellows in such equipment.

BACKGROUND OF THE INVENTION

Ion implantation has become a standard accepted technology of industry to dope workpieces such as silicon wafers or glass substrates with impurities in the large scale manufacture of items such as integrated circuits and flat panel displays. Conventional ion implantation systems include an ion source that ionizes a desired dopant element which is then accelerated to form an ion beam of prescribed energy. The ion beam is directed at the surface of the workpiece to implant the workpiece with the dopant element. The energetic ions of the ion beam penetrate the surface of the workpiece so that they are embedded into the crystalline lattice of the workpiece material to form a region of desired conductivity.

Ion energy is used to control junction depth in semiconductor devices. The energy levels of the ions that make up the ion beam determine the degree of depth of the implanted ions. High energy processes such as those used to form retrograde wells in semiconductor devices require implants of up to a few million electron volts (MeV), while shallow junctions may only demand energies below 1 thousand electron volts (1 keV).

A typical ion implanter comprises three sections or subsystems: (i) a terminal for outputting an ion beam, (ii) a beamline for mass resolving and adjusting the focus and energy level of the ion beam, and (iii) a target chamber which contains the semiconductor wafer to be implanted by the ion beam. The continuing trend to smaller and smaller semiconductor devices requires a beamline construction which serves to deliver high beam currents at low energies. The high beam current provides the necessary dosage levels, while the low energy levels permit shallow implants. Source/drain junctions in semiconductor devices, for example, require such a high current, low energy application.

Low energy ion beams which propagate through a given beamline construction suffer from a condition known as beam "blow-up", which refers to the tendency for like-charged ions within the ion beam to mutually repel each other. Such mutual repulsion causes a beam of otherwise desired shape to diverge away from an intended beamline path. Because the problem of beam blow-up increases with increasing beamline lengths, a design objective of preferred beamline constructions is to minimize or shorten the length of the beamline.

Typically, the target chamber is oriented generally perpendicularly with respect to the axis of the shortened beamline so that the ion beam strikes normal to the plane of the substrate. However, certain implants require the ion beam to strike the substrate at an orientation several degrees from normal. In order to permit such implants, the target chamber is made pivotable about the axis of the beam path. For example, a tilt-twist mechanism may be provided to allow pivoting in each of two perpendicular axes that generally lie in the plane of a substrate in the target chamber. An expansible bellows provides the interface between the beamline and the movable target chamber.

For applications where the bellows is required to move in simple axial compression or extension, no lateral forces are present, and the bellows corrugations can adequately handle the extensive or compressive forces in the axial direction. However, when the target chamber pivots with respect to the beamline path, the bellows typically experience shear forces in the plane perpendicular to the beam path. The bellows mounting is urged laterally within this plane (i.e., the bellows mounting tends to undergo a lateral offset). Even small lateral movements in metal welded bellows may cause large shear stresses at the mounting locations.

Fixedly mounting the bellows on both ends focuses these shear stresses in the plane perpendicular to the beam path (and parallel planes) at the locations of the fixed mountings. This shear stress may result in premature failure of the bellows by reducing the number of cycles in its lifetime. Because the implantation process is typically performed in a high vacuum (e.g., down to $1\times10^{-7}$ torr) process chamber to prevent dispersion of the ion beam and minimize the risk of contamination of the substrate by airborne particulates, any breach in the integrity of the bellows will result in loss of this vacuum condition. The loss of vacuum and the resulting contamination of the interior of the bellows will compromise the implantation process being performed.

It is an object of the present invention, then, to provide a means for alleviating the shear stress in a vacuum bellows. It is a further object of the present invention to provide an improved bellows for connecting two portions of an ion implanter that move with respect to each other. It is yet a further object of the invention to provide a lateral stress relief mechanism for a vacuum bellows, including a bellows for use in an ion implanter.

SUMMARY OF THE INVENTION

An improved bellows is provided for use in, for example, an ion implanter. The bellows assembly comprises a first mounting portion located at one end of the bellows assembly for fixedly mounting the bellows assembly to a first vacuum chamber, a second mounting portion located at an opposite end of the bellows assembly for slidably mounting the bellows assembly to a second vacuum chamber, and a stainless steel bellows located between the first and second mounting portions. The bellows extends generally along a longitudinal axis and is expansible and contractible along this axis. The second mounting portion permits radial slidable movement of the bellows assembly with respect to the second chamber in a first plane substantially perpendicular to this axis. The second mounting portion comprises at least one sliding seal subassembly for maintaining the vacuum, and a support ring and a slide plate located on opposite ends of the sliding seal subassembly. The slide plate and the sliding seal subassembly provide a slidable vacuum-tight mating surface therebetween.

DETAILED DESCRIPTION OF PREFERRED EMBODIMENTS OF THE INVENTION

Figure 1:
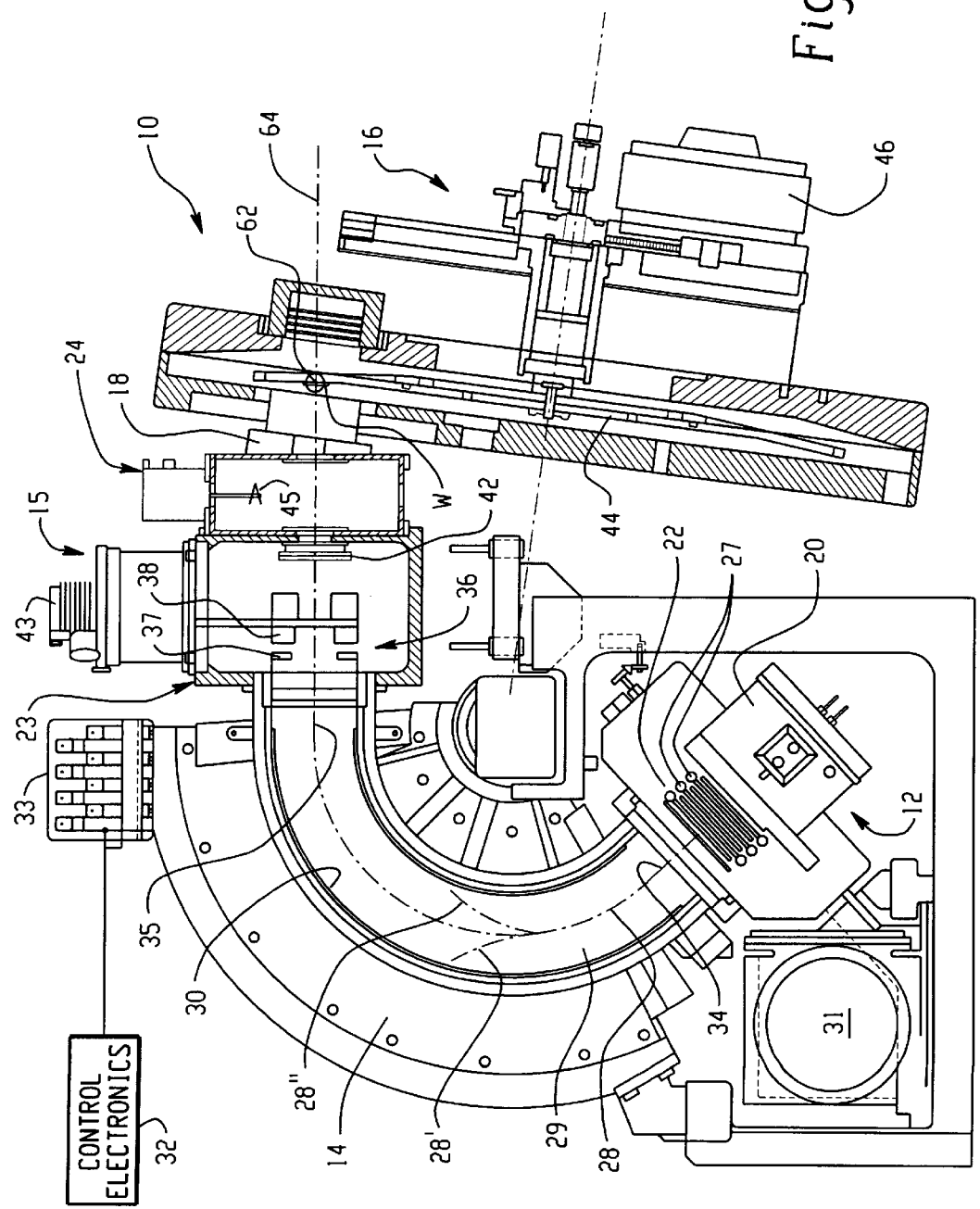
FIG. 1 is a plan view of an ion implanter into which the improved bellows of the present invention is incorporated.

Referring now to FIG. 1 of the drawings, an ion implanter, generally designated 10, is shown as comprising an ion source 12, a mass analysis magnet 14, a beamline assembly 15, and a target or end station 16. An expansible stainless steel bellows assembly 18, which permits movement of the end station 16 with respect to the beamline assembly 15, connects the end station 16 and the beamline assembly. Although FIG. 1 shows an ultra low energy (ULE) ion implanter, the present invention has applications in other types of implanters as well. The invention also has applications in any vacuum environment wherein a bellows that couples two components must undergo more than simple axial compression or extension, without compromising the integrity of the vacuum.

The ion source 12 comprises a plasma chamber 20 and an ion extractor assembly 22. Energy is imparted to an ionizable dopant gas to generate ions within the plasma chamber 20. Generally, positive ions are generated, although the present invention is applicable to systems wherein negative ions are generated by the source. The positive ions are extracted through a slit in the plasma chamber 20 by the ion extractor assembly 22 which comprises a plurality of electrodes 27. The electrodes are charged with negative potential voltages, increasing in magnitude as the distance from the plasma chamber slit increases. Accordingly, the ion extractor assembly functions to extract a beam 28 of positive ions from the plasma chamber and accelerate the extracted ions into the mass analysis magnet 14.

The mass analysis magnet 14 functions to pass only ions of an appropriate charge-to-mass ratio to the beamline assembly 15, which comprises a resolver housing 23 and a beam neutralizer 24. The mass analysis magnet 14 includes a curved beam path 29 which is defined by an aluminum beam guide 30, evacuation of which is provided by a vacuum pump 31. The ion beam 28 that propagates along this path is affected by the magnetic field generated by the mass analysis magnet 14, to reject ions of inappropriate charge-to-mass ratio. The strength and orientation of this magnetic field is controlled by control electronics 32 which adjust the electrical current through the field windings of the magnet 14 through magnet connector 33.

The magnetic field causes the ion beam 28 to move along the curved beam path 29, from a first or entrance trajectory 34 near the ion source 12 to a second or exit trajectory 35 near the resolving housing 23. Portions 28' and 28" of the beam 28 comprised of ions having an inappropriate charge-to-mass ratio are deflected away from the curved trajectory and into the walls of aluminum beam guide 30. In this manner, the magnet 14 passes to the resolving housing 23 only those ions in the beam 28 which have the desired charge-to-mass ratio.

The resolver housing 23 includes a terminal electrode 37, an electrostatic lens 38 for focusing the ion beam, and a dosimetry indicator such as a Faraday flag 42. The beam neutralizer 24 includes a plasma shower 45 for neutralizing the positive charge that would otherwise accumulate on the target wafer as a result of being implanted by the positively charged ion beam 28. The beam neutralizer and resolver housings are evacuated by vacuum pump 43.

Downstream of the beam neutralizer 24 is the end station 16, which includes a disk-shaped wafer support 44 upon which wafers to be treated are mounted. The wafer support 44 resides in a target plane which is (generally) perpendicularly orientated to the direction of the implant beam. The disc shaped wafer support 44 at the end station 16 is rotated by motor 46. The ion beam thus strikes wafers mounted to the support as they move in a circular path. The end station 16 pivots about point 62 which is the intersection of the path 64 of the ion beam and the wafer W so that the target plane is adjustable about this point. In this manner, the angle of ion implantation may be slightly modified from the normal. The expansible bellows, shown in more detail in FIG. 2, permits this relative movement of the end station 16 and the beamline assembly 15. Bellows in the ULE environment must be compact to minimize the length of the beamline. As such, the number of expansible bellows corrugations is limited, as is its ability to absorb lateral shear stresses.

Figure 2:
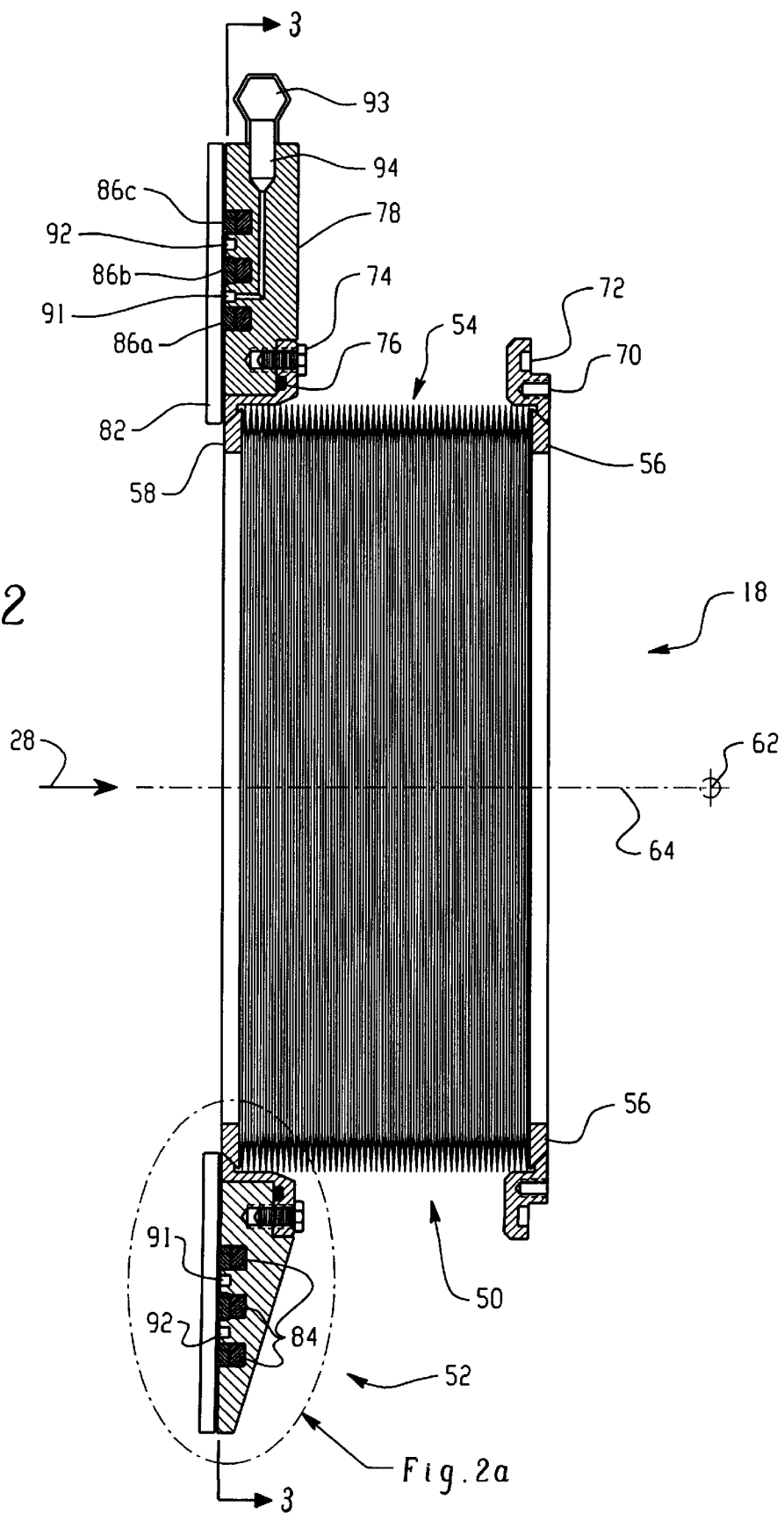
FIG. 2 is a cross sectional view of the implanter bellows shown in the ion implanter of FIG. 1.

As shown in FIG. 2, the expansible bellows assembly 18 comprises a bellows assembly 50 and a slidable seal assembly 52. The bellows assembly 50 is constructed of stainless steel and comprises a bellows 54, an end station mounting bracket 56, and a sliding seal mounting bracket 58. Although shown in cross section, the expansible bellows assembly 18 must be capable of maintaining a vacuum, and as such comprises an enclosed assembly, that is, the metal bellows assembly 50 is generally cylindrical in shape, and the sliding seal assembly 52 is generally annular in shape.

Although the stiffness of the metal bellows is generally about 1200 lb./in., the bellows can pivot about pivot point 62 in the plane that is perpendicular to axis 64 along which the ion beam 28 travels. As shown in FIG. 1, point 62 is the intersection of the axis 64 and the plane of a wafer W supported by the disc shaped wafer support 44. The disc shaped wafer support 44 is provided with tilt and twist mechanisms (not shown) which pivot the wafer support, respectively, about the two linear axes that define the plane normal to the axis 64. Pivoting the wafer support 44 about the point 62 causes lateral forces and resulting shear stresses to be exerted in this plane and parallel planes. The pivoting causes an arc to be swept equal to the pivot angle and the distance from point 62.

The end station mounting bracket 56 is provided with threaded bores 70 through which the bracket 56 may be bolted to the end station 16. Alternatively, the mounting bracket may be made integral with the end station. Groove 72 is provided for a sealing element such as an elastomeric O-ring (not shown) to maintain a vacuum seal between the bellows assembly 50 and the end station.

The sliding seal mounting bracket 58 is provided with threaded bores through which the bracket 58 may be bolted to the slidable seal assembly 52 using bolts 74. Alternatively, the mounting bracket 58 may be made integral with the slidable seal assembly. A sealing element such as an elastomeric O-ring 76 is disposed within a circumferential groove in the bracket 58 to maintain a vacuum seal between the bellows assembly 50 and the slidable seal assembly 52.

The slidable seal assembly 52 comprises a support ring 78, a plurality of seal subassemblies 80 (see FIG. 2a) and a slide plate 82. The support ring 78 may be made integral with the bellows bracket 58. The support ring 78 and the slide plate 82 are made of stainless steel.

As explained above, seal 76 provides a vacuum-tight connection between the bellows assembly 50 and the support ring 78. As explained further below, the seal subassemblies 80 provide a vacuum-tight connection between the support ring 78 and the slide plate 82. Additionally, conventional vacuum seal means may be provided between the slide plate 82 and the neutralizer housing, as is known in the art, to complete the vacuum system. Alternatively, the slide plate 82 may be made integral with the neutralizer housing and ground flat to provide a hard and smooth sealing surface.

Figure 2A:
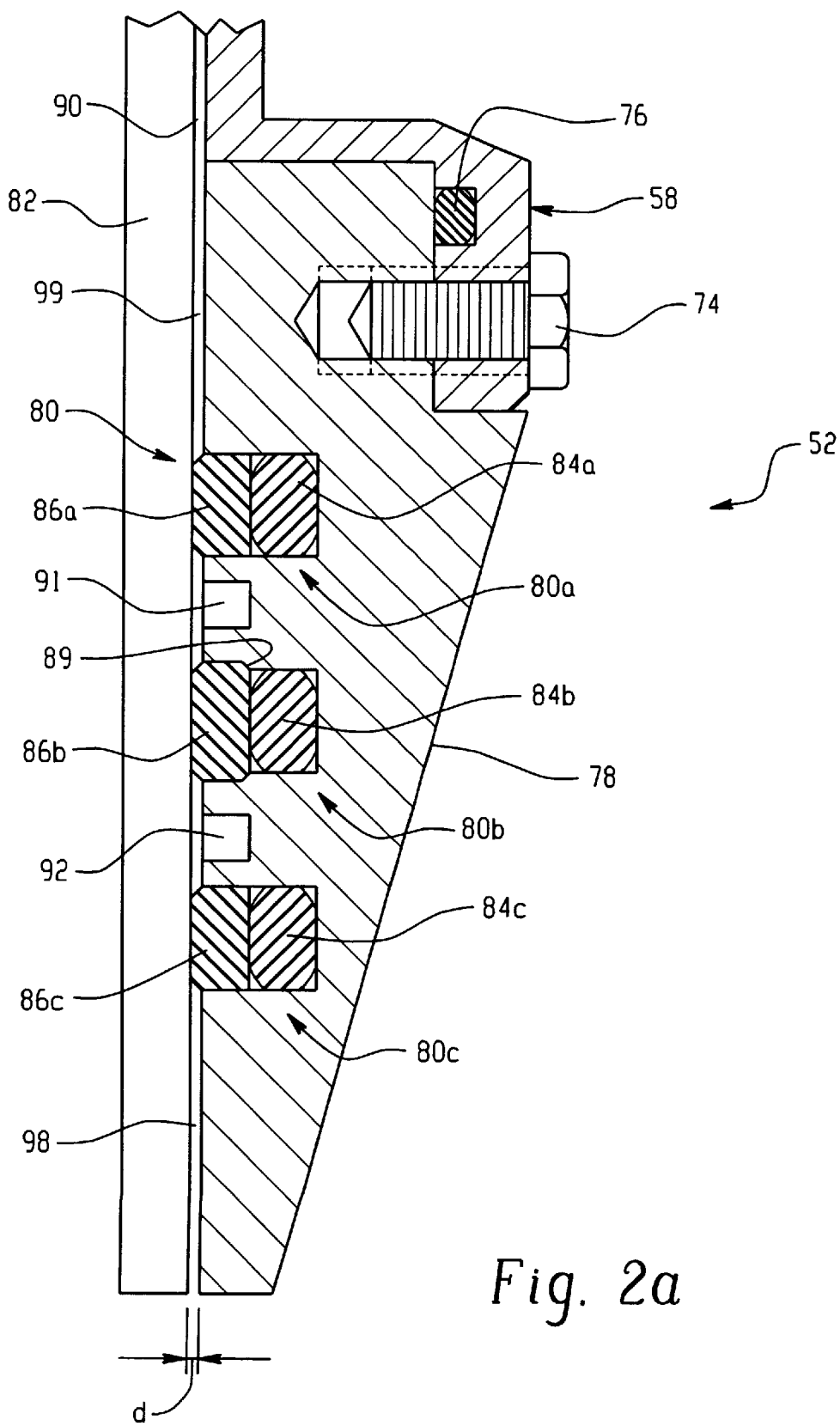
FIG. 2a is an expanded fragmentary view of the slidable seal assembly of the implanter bellows of FIG. 2.
Figure 3:
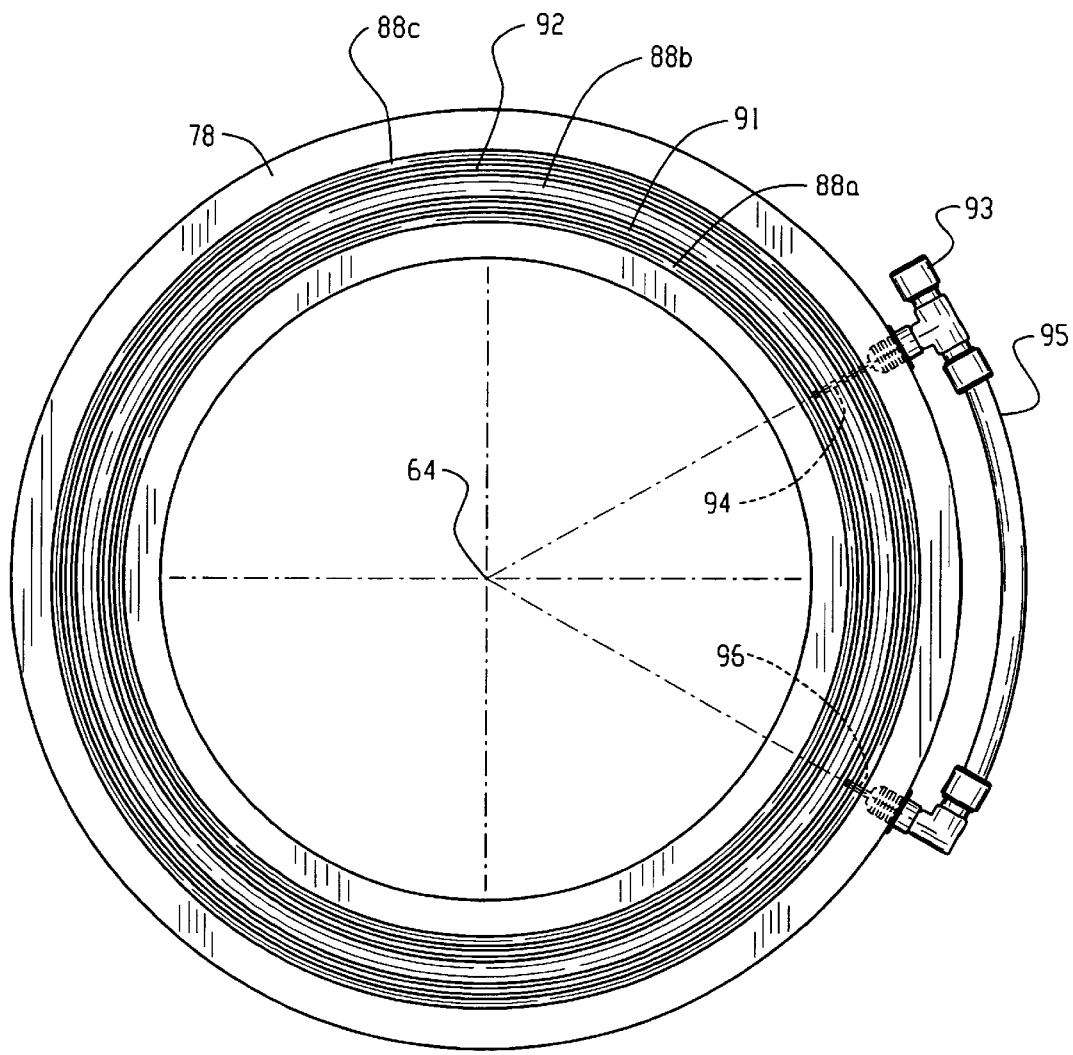
FIG. 3 is an end view of the support ring of the slidable seal assembly of the implanter bellows shown in FIG. 2, taken along the lines 3—3.

The seal subassemblies 80 are shown in greater detail in FIG. 2a. Each of the subassemblies 80a, 80b and 80c comprise an elastomeric O-ring 84 and a slide ring 86. The elastomeric O-rings 84a–c may be made of, for example, a fluoroelastomer dipolymer, such as Viton® (type 9711), which is a registered trademark of the E. I. DuPont de Nemours and Company, Wilmington Del. The slide rings 86a–c may be made of, for example, an ultra high molecular weight (UHMW) polyethylene material. In the preferred embodiment, the slide rings 86a–c are relatively inelastic, when compared to the elasticity of the O-rings 84a–c. As shown in FIG. 3 (an end view of the support ring 78), each of the seal subassemblies 80a, 80b and 80c is disposed within respective circumferential grooves 88a, 88b and 88c in the support ring 78. Groove 88b, in which center seal subassembly 80b is disposed, is provided with a shoulder 89, against which the center slide ring 86b rests. As a result, a small gap 90 exists at the interface of the slide plate 82 and the slide rings 86 at locations other than that of the slide rings. As shown in FIG. 2a, the distance d of this gap 90 is on the order of 0.5 millimeter (mm).

The UHMW slide rings 86 provide a vacuum-tight seal between the support ring 78 and the slide plate 82, while permitting slidable movement of these two elements with respect to each other. The sliding interface between the support ring 78 and the slide plate 82 absorbs the lateral forces and resulting shear stresses exerted by the pivoting wafer support 44, which would otherwise need to be absorbed by the body of the bellows.

In operation, the end station 16 pivots about point 62 in the plane that is perpendicular to the beam axis 64. This plane is parallel to that formed by the interface of the support ring 78 and the slide plate 82. The relative movement of the support ring and the slide plate minimizes any lateral shear forces in the plane of the interface. Small lateral movements of up to 2 centimeters (cm) thereby prevent these lateral shear forces from being transmitted to the bellows assembly 50. As such, the slidable seal assembly 52 permits true radial movement of the bracket 58 with respect to beam axis 64.

The use of the UHMW slide rings 86 between the support ring 78 and the slide plate 82 permits such lateral movement without compromising the vacuum condition within the bellows. Vacuum is provided by an external pump (not shown) that pumps air out of circumferential channels 91 and 92 in the support ring 78. The external pump is connected to inner channel 91 via port 93 and channel 94. The pump is connected to outer channel 92 via port 93, tubing 95 and channel 96.

In operation, the exterior of the bellows assembly 18, represented by radially outward portion 98 of the gap 90 between the support ring 78 and the slide plate 82 (FIG. 2a), resides at atmospheric pressure (P1). The interior of the bellows assembly 18, represented by radially inward portion 99 of the gap 90 between the support ring 78 and the slide plate 82, resides at process pressure (P3) (e.g., vacuum conditions down to $1 \times 10^{-7}$ torr). The external pump evacuates the channels 91 and 92 to a sub-atmospheric pressure P2 that is intermediate pressures P1 and P3.

Although the preferred embodiment of the present invention is shown using three seal subassemblies 80a, 80b and 80c, it is contemplated that merely two subassemblies may be sufficient. For example, if only seal subassemblies 80b and 80c were provided, only channel 92 would be evacuated by the external pump to intermediate pressure P2. The addition of seal assembly 80a is provided as a safety mechanism for maintaining the pressure differential between the exterior and interior of bellows assembly 18, residing at pressures P1 and P3, respectively.

Accordingly, a preferred embodiment of an improved bellows for an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A bellows assembly (18) comprising:
   a first mounting portion (56) located at one end of the bellows assembly for fixedly mounting the bellows assembly to a first chamber (16);
   a second mounting portion (52) located at an opposite end of the bellows assembly for slidably mounting the bellows assembly to a second chamber (15); and
   a bellows (54) located between said first and second mounting portions, said bellows extending generally along a longitudinal axis (64) and being expansible and contractible along said axis;
   said second mounting portion (52) permitting radial slidable movement of said bellows assembly with respect to said second chamber in a first plane substantially perpendicular to said axis (64).

2. The bellows assembly (18) of claim 1, wherein an interior of said bellows provides a vacuum chamber for maintaining a vacuum condition between said first and second chambers, and said second mounting portion (54) includes a sliding seal (84, 86) for maintaining said vacuum.

3. The bellows assembly (18) of claim 2, wherein said first and second chambers are components of an ion implantation system (10).

4. The bellows assembly (18) of claim 2, wherein said sliding seal (84, 86) is comprised of at least one seal subassembly (80) each comprising a fluoroelastomer dipolymer ring (84) and a polyethylene material ring (86), and wherein said polyethylene material ring is relatively inelastic as compared to the elasticity of said fluoroelastomer dipolymer ring.

5. The bellows assembly (18) of claim 2, wherein said first chamber (16) lies in a second plane that is parallel to said first plane and pivots with respect to said second chamber (15) about a pivot point (62) along said axis (64).

6. The bellows assembly (18) of claim 2, wherein said bellows (60) is comprised of steel.

7. The bellows assembly (18) of claim 4, wherein said second mounting portion (52) further comprises a support ring (78) and a slide plate (82) located on opposite ends of said at least one seal subassembly (80), said slide plate (82) and said at least one seal subassembly (80) providing a slidable mating surface therebetween.

8. The bellows assembly (18) of claim 7, wherein said at least one seal subassembly (80) comprises two seal subassemblies (80b, 80c), and wherein a space (92) defined by said seal subassemblies (80b, 80c), said support ring (78) and said slide plate (82) is evacuated to a sub-atmospheric pressure (P2).

9. The bellows assembly (18) of claim 8, wherein said two seal subassemblies (80b, 80c) reside at least partially within circumferential grooves (88b, 88c) in said support ring (78), one of said circumferential grooves (88b) being provided with a shoulder (89) against which one of said rings (86b) rests.

10. The bellows assembly (18) of claim 7, wherein said at least one seal subassembly (80) comprises three seal subassemblies (80a, 80b, 80c), and wherein a first space (92) and a second space (91) are evacuated to a sub-atmospheric pressure (P2), said first space defined by said seal subassemblies (80b, 80c), said support ring (78) and said slide plate (82), said second space defined by said seal subassemblies (80a, 80b), said support ring (78) and said slide plate (82).

11. The bellows assembly (18) of claim 10, wherein said three seal subassemblies (80a, 80b, 80c) reside at least partially within circumferential grooves (88a, 88b, 88c) in said support ring (78), one of said circumferential grooves (88b) being provided with a shoulder (89) against which one of said rings (86b) rests.

12. A slidable bellows mounting (52) for slidably coupling a bellows assembly between two vacuum chambers, wherein the bellows assembly extends generally along a longitudinal axis (64) and is expansible and contractible along the axis, the mounting (52) comprising:

a mounting portion (52) located on one end of the bellows assembly for slidably mounting the bellows assembly to a vacuum chamber (15) to permit radial slidable movement of the bellows assembly with respect to the vacuum chamber (15) in a first plane substantially perpendicular to said axis (64), said mounting portion (52) including a sliding seal (84, 86) for maintaining vacuum.

13. The slidable bellows mounting (52) of claim 12, wherein said sliding seal (84, 86) is comprised of at least one seal subassembly (80) each comprising a fluoroelastomer dipolymer ring (84) and a polyethylene material ring (86), and wherein said polyethylene material ring is relatively inelastic as compared to the elasticity of said fluoroelastomer dipolymer ring.

14. The slidable bellows mounting (52) of claim 13, wherein said at least one seal subassembly (80) comprises two seal subassemblies (80b, 80c), and wherein a space (92) defined by said seal subassemblies (80b, 80c), said support ring (78) and said slide plate (82) is evacuated to a sub-atmospheric pressure (P2).

15. The slidable bellows mounting (52) of claim 14, wherein said two seal subassemblies (80b, 80c) reside at least partially within circumferential grooves (88b, 88c) in said support ring (78), one of said circumferential grooves (88b) being provided with a shoulder (89) against which one of said rings (86b) rests.

16. The slidable bellows mounting (52) of claim 13, wherein said at least one seal subassembly (80) comprises three seal subassemblies (80a, 80b, 80c), and wherein a first space (92) and a second space (91) are evacuated to a sub-atmospheric pressure (P2), said first space defined by said seal subassemblies (80b, 80c), said support ring (78) and said slide plate (82), said second space defined by said seal subassemblies (80a, 80b), said support ring (78) and said slide plate (82).

17. The slidable bellows mounting (52) of claim 16, wherein said three seal subassemblies (80a, 80b, 80c) reside at least partially within circumferential grooves (88a, 88b, 88c) in said support ring (78), one of said circumferential grooves (88b) being provided with a shoulder (89) against which one of said rings (86b) rests.

* * * * *